(12) United States Patent
Visser

(10) Patent No.: US 6,577,219 B2
(45) Date of Patent: Jun. 10, 2003

(54) MULTIPLE-INTERLEAVED INTEGRATED CIRCUIT TRANSFORMER

(75) Inventor: Hendrik Arend Visser, Milpitas, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 48 days.

(21) Appl. No.: 09/895,920

(22) Filed: Jun. 29, 2001

(65) Prior Publication Data

US 2003/0001709 A1 Jan. 2, 2003

(51) Int. Cl.[7] .................................................. H01F 5/00
(52) U.S. Cl. ....................... 336/200; 336/223; 336/232; 336/192; 336/180
(58) Field of Search ................................. 336/200, 223, 336/232, 70, 180, 61, 192, 183; 29/605

(56) References Cited

U.S. PATENT DOCUMENTS

| | | | |
|---|---|---|---|
| 4,816,784 A | * | 3/1989 | Rabjohn ................... 333/24 R |
| 5,061,910 A | | 10/1991 | Bonny |
| 5,477,204 A | * | 12/1995 | Li .............................. 336/200 |
| 5,543,773 A | | 8/1996 | Evans et al. |
| 5,570,074 A | | 10/1996 | Steigerwald et al. |
| 5,625,883 A | * | 4/1997 | Leyten et al. ................. 455/41 |
| 6,150,914 A | | 11/2000 | Borho et al. |
| 6,175,727 B1 | * | 1/2001 | Mostov ....................... 455/307 |
| 6,236,297 B1 | * | 5/2001 | Chou et al. ................. 336/200 |

FOREIGN PATENT DOCUMENTS

| | | |
|---|---|---|
| WO | WO 99/31682 | 6/1999 |
| WO | WO 0045399 A | 8/2000 |

* cited by examiner

Primary Examiner—Anh Mai
(74) Attorney, Agent, or Firm—Kevin Simons

(57) ABSTRACT

Each coil of a transformer is partitioned into two or more parallel segments. The multiple segments of each coil are interleaved with each other to form a coplanar interleaved transformer that has a greater coupling efficiency than a non-segmented coplanar interleaved transformer. In a preferred embodiment, the multiple segments are of reduced width, so that the interleaved coils consume substantially the same area as the non-segmented coplanar interleaved transformer, thereby maintaining the same inductance as the non-segmented transformer. To provide for maximum efficiency, each segment of each coil is embodied so as to have substantially equal length as each other segment of the coil.

14 Claims, 1 Drawing Sheet

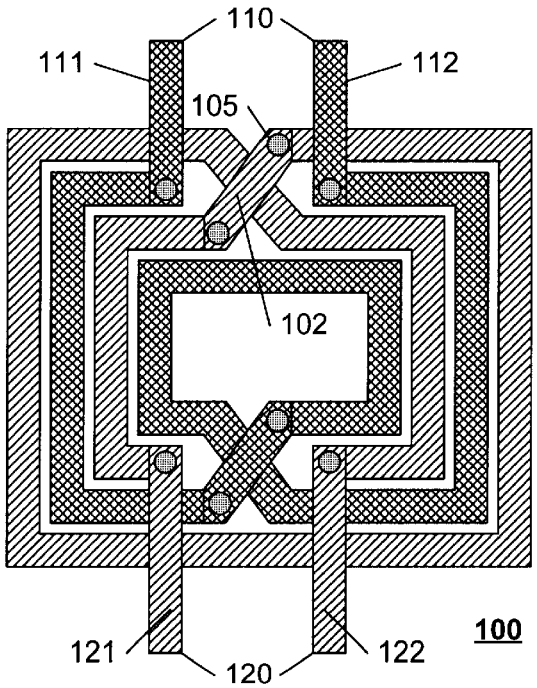
FIG. 1 [Prior Art]
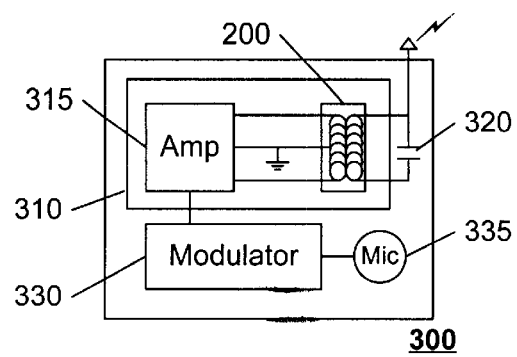
FIG. 3
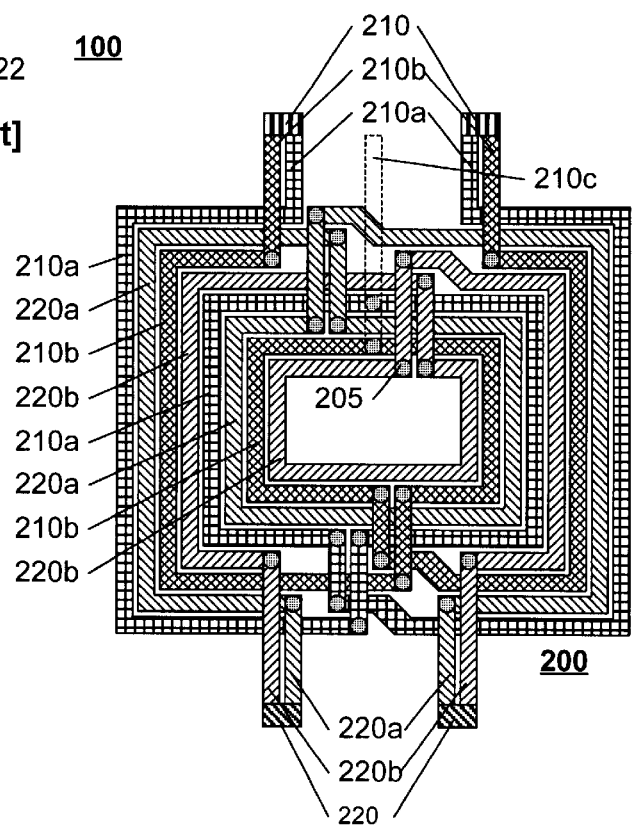
FIG. 2

MULTIPLE-INTERLEAVED INTEGRATED CIRCUIT TRANSFORMER

BACKGROUND OF THE INVENTION

1. Field of the Invention

This invention relates to the field of integrated circuits, and in particular to the design of an interleaved transformer device with improved coupling characteristics.

2. Description of Related Art

A transformer comprises two coils of wire that are electromagnetically coupled. An AC signal applied to one of the coils of wire, nominally termed the primary coil, induces a corresponding AC signal on the other coil, nominally termed the secondary coil. The efficiency of the coupling between the coils determines the efficiency of the energy transfer from one coil to the other, as well as the overall noise sensitivity of the transformer.

Transformers are generally used to provide electrical isolation between signals, often to allow for a change of voltage reference planes. Transformers are also often used to couple a signal to a resonant L-C circuit, one of the coils of the transformer providing the inductance, or a portion of the inductance. Radio-frequency (RF) transmitters typically include an RF transformer that couples an output stage to a resonant antenna stage.

Discrete transformers include two coils of wire that are wrapped around a core, which may be an air core, or a ferrite core, for improved coupling efficiency. The coils may be stacked, one atop the other on a common core, or may be wrapped one after the other on the common core, or may be formed by interleaving the wires and then wrapping the combination of the wires about the common core.

Stacked and interleaved transformers may be similarly constructed on multi-layer integrated circuits. Stacked coils can be implemented by forming conductive spirals of conductors on each of two layers, one atop the other. A transformer with interleaved coils is formed by laying the conductors of each coil adjacent to each other on the same conductive layer in a spiral pattern. A stacked core exhibits a high capacitance, because the two co-located spirals, one atop the other, effectively form two plates of a capacitor. This capacitive coupling between the coils introduces phase-shift and amplitude errors during the coupling process. In a transformer with interleaved coils, because the conductors are adjacent each other, rather than atop each other as in the stacked embodiment, the capacitive coupling is substantially less, thereby providing less phase-shift and less amplitude error.

FIG. 1 illustrates an example layout of a coplanar interleaved transformer 100. Terminals 111 and 112 are the terminals of a first coil 110, and terminals 121 and 122 are the terminals of a second coil 120. Different cross-hatching is used for the conductors of each coil, for ease of illustration and understanding. Both coils are substantially on the same integrated circuit layer, preferably the heavy metallic layer, for minimal resistance losses. Interconnection segments 102 are located on a second circuit layer, to allow for insulated cross-overs of routing, as required. Connections between layers are illustrated by the circular areas 105, for ease of distinction in the illustrations. The coplanar interleaved transformer of FIG. 1 provides less capacitive coupling between coils than a stacked configuration, but consumes more area than a stacked configuration, and provides less efficient coupling than the stacked configuration.

U.S. Pat. No. 5,543,773, "TRANSFORMERS AND COUPLED INDUCTORS WITH OPTIMUM INTERLEAVING OF WINDINGS", issued Aug. 6, 1996 to Peter D. Evans and William J. B. Heffernan, teaches the interleaving of parallel segments of one of the coils, to achieve different turn-ratios, and is incorporated by reference herein. The referenced patent includes a coplanar transformer having a continuous primary coil spiral wound about a ferrite core, with interleaved segments of a secondary coil that are connected in parallel to effect a non-unity turns ratio. To improve the coupling between the primary and secondary coils, additional turns are conventionally used. For example, in the referenced patent, a 12:2 turns-ratio of actual turns is used to effect a 6:1 electrical turns-ratio; a 12:6 actual turns-ratio is used to effect a 2:1 turns-ratio, and so on. These additional actual turns increase the inductive coupling between the coils, while still maintaining the desired electrical turns-ratio that determines the ratio between input and output currents ($n1*i1=n2*i2$). Increasing the number of actual turns, however, increases the resistance, as well as the inductance, of each coil. In a coplanar transformer, increasing the number of actual turns substantially increases the area consumed by the transformer.

BRIEF SUMMARY OF THE INVENTION

It is an object of this invention to provide a transformer structure that provides the relatively low capacitance of a conventional coplanar interleaved transformer, but with improved coupling efficiency and effectiveness. It is a further object of the invention to provide a coplanar transformer structure that provides improved coupling efficiency and effectiveness, without substantially increasing the inductance or resistance of the coils.

These objects and others are achieved by splitting each coil into two or more parallel segments, and interleaving the multiple segments of each coil with each other to form an interleaved coil that has a greater coupling efficiency than a non-segmented interleaved transformer. Because the multiple segments of each coil are connected in parallel, the resistance of the coil is decreased, or, the width of the conductor used to form the coil can be decreased while maintaining the same resistance. By reducing the width of the conductors used in a coplanar transformer, the additional parallel segments can be placed in substantially the same area as the conventional transformer, thereby maintaining the same inductance. To provide for maximum efficiency, each segment of each coil is embodied so as to have substantially equal length as each other segment of the coil.

BRIEF DESCRIPTION OF THE DRAWINGS

The invention is explained in further detail, and by way of example, with reference to the accompanying drawings wherein:

FIG. 1 illustrates an example layout of a prior art interleaved transformer; and FIG. 2 illustrates an example layout of an interleaved transformer in accordance with this invention.

FIG. 3 illustrates an example handheld communications device that includes an interleaved transformer in accordance with this invention.

Throughout the drawings, the same reference numerals indicate similar or corresponding features or functions.

DETAILED DESCRIPTION OF THE INVENTION

This invention attempts to increase the inductive coupling between the coils of a transformer without substantially increasing the capacitive coupling between the coils. To minimize the capacitive coupling, the coils are preferably located in a common plane, or layer, so that, effectively, only the edges of the conductors in the coils contribute to the capacitance between the coils. To increase the inductive coupling, a plurality of coil segments are used to form each of the primary and secondary coils of the transformer. Each plurality of coil segments is connected in parallel with the other coil segments of the plurality forming the primary or secondary coil of the transformer.

The layout of a plurality of coil segments in lieu of a single coil will consume substantially greater area than a conventional interleaved transformer, if the same number of windings of equal sized conductors is used in each of the plurality of coil segments as are used in the coil of the conventional transformer. As is commonly known, the resistance per unit length of a conductor on an integrated circuit or printed circuit board is inversely proportional to the width of the conductor. In a conventional transformer embodiment, a maximum resistive loss is defined for each of the coils, and the conductor width is defined accordingly. In accordance with this invention, because each of the plurality of coil segments forming the primary and secondary coils are connected in parallel, the width of the conductor can be correspondingly decreased without increasing the resistance of the coil. That is, for example, if the conductor of a coil of a conventional transformer is 20 microns wide, and if two coil segments are connected in parallel to form the coil in accordance with this invention, the conductors of each of the two coil segments can be reduced to 10 microns wide, without increasing the resistance of the coil. Thus, the area consumed by the conductors of the plurality of the coil segments will be the same as the area consumed by the conductor of a conventional coil, and the only additional area will be the area required to provide insulating space between the conductors.

In accordance with this invention, the improved coupling achieved by the plurality of coil segments generally allows for a reduction in the required number of windings per coil. Also, or alternatively, the increased coupling provides for a more efficient energy transfer, and thereby the possible increase in transformer area may be offset by decreases in other components of a system, based on reduced power requirements, a reduced need for noise filtering, and so on.

As is known in the art, the inductance of a planar coil is determined by the effective diameter of the coil and the number of turns in the coil. By using narrower conductors in the coil segments, as discussed above, the diameter of the plurality of coil segments that are used in lieu of the single coil need not substantially increase the effective diameter of the coil. In accordance with this invention, the plurality of coil segments have the same number of turns as the conventional coil, and thus the inductance of the coil remains substantially the same as the conventional coil. As discussed further below, there will be a slight reduction in the inductance of the coil, caused by the lower inductance of the innermost coil segment, but this lower inductance is somewhat offset by the higher coupling factor achieved by this invention.

FIG. 2 illustrates a layout of an example coplanar interleaved transformer 200 comprising two parallel configured coil segments 210a, 210b that form a primary coil 210, and two parallel configured coil segments 220a, 220b that form a secondary 220 coil of the transformer 200 in accordance with this invention. As in FIG. 1, the coil segments are substantially contained on a single plane, or layer, of an integrated circuit, preferably a heavy metal layer, for minimal conductor resistance. Segments 202 are provided on a different layer that is insulated from the coil layer, thereby allowing for crossovers as required, using vias 205 to connect between layers.

In accordance with this invention, because there are two coil segments per coil, the conductors forming each of the coil segments 210a–b, 220a–b are half the width of the corresponding conductors 110, 120 in FIG. 1, thereby providing coils 210, 220 having substantially the same resistance as the corresponding coils 110, 120. Because twice as many conductors are coupled between each coil 210, 220, the efficiency of the coupling in the transformer 200 is substantially greater than the efficiency of the coupling in the transformer 100.

By using two conductors 210a–b, 220a–b of half width for each coil 210, 220, the size of the transformer 200 is not substantially larger than the transformer 100 of FIG. 1, thereby providing substantially the same effective diameter for each coil 210, 220 as the corresponding coil 110, 120. In this manner, the inductance of each coil 210, 220 is substantially the same as the inductance of each coil 110, 120. Note, however, that the innermost coil segments of the transformer 200 will have a somewhat smaller diameter than the corresponding coils of the transformer 100, thereby producing a somewhat lower inductance. This lower inductance, being in parallel with the inductance of the other coil segments, reduces the total inductance of the coil. This reduction, however, is somewhat offset by the improved coupling factor of the paralleled coil segments (effective inductance=inductance*(1+coupling factor)).

The efficiency of the coupling between the coils 210, 220 can be further increased by providing additional coil segments in parallel. In accordance with this invention, each additional coil segment allows the width of the conductor used to be correspondingly decreased, thereby maintaining the overall size of the transformer substantially constant. That is, for example, with three parallel coil segments, the width of each conductor is one-third of the width of the conventional transformer 100 of FIG. 1; four parallel coil segments will use conductors of one-quarter width, and so on. Only when the accumulation of spacing between conductors becomes substantial, or the determined reduced width is less than the required minimum conductor size allowed by the manufacturing technology, will the size of the transformer change substantially compared to that of FIG. 1.

Each of the coil segments 210a, 210b and 220a, 220b forming each of the primary 210 and secondary 220 coils, respectively, are preferably of substantially equal length and equal inductance, so as to balance the current flow between the parallel paths. As illustrated, the conductors of the coil segments are arranged, from the outer edge to the inner edge, in the order of: 210a, 220a, 210b, 220b, 210a, 220a, 210b, 220b, hereinafter termed an aa-bb-aa-bb arrangement, indicating that the "a" primary and secondary coils are at the outer loop, then the "b" primary and secondary coils, then the "a" coils again, then the "b" coils. In this example arrangement, the "a" coils will be somewhat longer in length than the "b" coils. An alternative aa-bb-bb-aa arrangement could provide more balanced lengths, although the equality of lengths is not critical, and need only be approximate.

Illustrated in FIG. 2 is an optional center-tap 210c on the primary coil 210; alternatively, or additionally, a center-tap can be provided on the secondary coil 220. As would be evident to one of ordinary skill in the art, other taps, such as ratioed taps can also be provided.

This invention is particularly well suited for handheld devices, such as cell telephones, where light weight and compact design are preferred. FIG. 3 illustrates a typical handheld transmitter that includes a transformer 200 that is located on the same integrated circuit 310 that contains a conventional transmission amplifier 315. As illustrated, the centertapped primary coil of the transformer 200 is driven by the amplifier, and a capacitor 320 is coupled to the secondary coil, to form a resonant circuit that is coupled to a transmitting antenna 325. As is known in the art, the resonant frequency of a resonant circuit is determined by the product of the inductance and the capacitance, and the quality of the resonant circuit is determined by the resistance in the resonant circuit. A modulator 330 that receives, for example, voice input from a microphone 335, provides the input to the amplifier 315. Optionally, the modulator 330 may be included on the same integrated circuit 310 as the amplifier 315.

By providing the plurality of paralleled coil segments that substantially maintain the inductance and resistance of the conventional transformer, but with increased coupling efficiency, improved performance of the device 300 can be achieved via this invention without introducing a substantial design change.

FIG. 2 illustrates two parallel coil segments ("a" and "b") forming each of the primary 210 and secondary 220 coils, although the principles of this invention are applicable to any number of parallel coils. For example, three coils may be arranged as aa-bb-cc-aa-bb-cc, or aa-bb-cc-bb-cc-aa, or other combinations that tend to provide approximately equal coil lengths. In like manner, to achieve a different turns-ratio, one coil 210, 220 may have one number of parallel coils, and the other coil may have a different number of parallel coils. For example, if one coil has parallel coils a, b, and c, and the other coil has parallel coils A and B, the arrangement could be a-A-b-B-c-a-A-b-B-c, for a 3:2 turns ratio. Note, however, that the efficiency of the interlaced transformer is best at a 1:1 turns ratio, because the repeated conductors of one coil (the "c-a" arrangement in this example) does not occur in a 1:1 turns ratio arrangement.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

I claim:

1. A transformer comprising:
   a primary coil and
   a secondary coil,
   wherein
   the primary and secondary coils are coplanar, and
   each of the primary and secondary coils includes
      a plurality of coil segments that are configured to provide parallel current paths to input terminals of the corresponding primary and secondary coils,
      each of the plurality of coil segments also being coplanar.

2. The transformer of claim 1, wherein
   the coplanar primary and secondary coils are located on a common layer of an integrated circuit.

3. The transformer of claim 1, further including
   a center tap terminal on at least one of the primary and secondary coils.

4. The transformer of claim 1, wherein
   each of the plurality of coil segments comprises a conductor of approximately equal length to conductors of other coil segments of the plurality of coil segments.

5. The transformer of claim 1, wherein
   each of the primary and secondary coils include an equal number of coil segments.

6. An integrated circuit comprising
   a transformer that includes:
      a primary coil and
      a secondary coil,
   wherein
   the primary and secondary coils are coplanar, and
   each of the primary and secondary coils includes
      a plurality of coil segments that are configured to provide parallel current paths to input terminals of the corresponding primary and secondary coils,
      each of the plurality of coil segments also being coplanar.

7. The integrated circuit of claim 6, wherein
   the coplanar primary and secondary coils are located on a common layer of the integrated circuit.

8. The integrated circuit of claim 6, further including
   a center tap terminal on at least one of the primary and secondary coils.

9. The integrated circuit of claim 6, wherein
   each of the plurality of coil segments comprises a conductor of approximately equal length to conductors of other coil segments of the plurality of coil segments.

10. The integrated circuit of claim 6, further including
    a capacitor that is coupled to at least one of the primary and secondary coils to form a resonant circuit.

11. The integrated circuit of claim 6, wherein
    each of the primary and secondary coils include an equal number of coil segments.

12. A mobile device comprising:
    an integrated circuit that includes
       an amplifier that is configured to provide an output signal, and
       a transformer, operably coupled to the amplifier, that includes:
          a primary coil that is configured to receive the output signal, and
          a secondary coil that is operably coupled to a capacitor to form a resonant circuit, and
    an antenna that is operably coupled to the resonant circuit;
    wherein
    the transformer includes:
       a first plurality of coil segments that are operably coupled in parallel to form the primary coil, and
       a second plurality of coil segments that are operably coupled in parallel to form the secondary coil; and,
    the primary coil and the secondary coil are substantially located on a common layer of the integrated circuit.

13. The mobile device of claim 12, further including:
    a modulator that is configured to modulate an input signal to form a modulated input to the amplifier.

14. The mobile device of claim 13, wherein
    the modulator is located within the integrated circuit.

* * * * *